US008829955B1

(12) United States Patent
Goswami

(10) Patent No.: US 8,829,955 B1
(45) Date of Patent: Sep. 9, 2014

(54) ISOLATOR-BASED TRANSMISSION SYSTEM WITH SIDE ISOLATOR CHANNEL FOR REFRESH SIGNALS

(71) Applicant: Bikiran Goswami, Norwood, MA (US)

(72) Inventor: Bikiran Goswami, Norwood, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 13/828,387

(22) Filed: Mar. 14, 2013

(51) Int. Cl.
*H03L 7/00* (2006.01)
*H03K 5/00* (2006.01)

(52) U.S. Cl.
CPC .................................. *H03K 5/00* (2013.01)
USPC .................................................. 327/141

(58) Field of Classification Search
CPC ............... H04L 25/0266; H01F 19/085
USPC .................................................. 327/141
See application file for complete search history.

(56) References Cited

U.S. PATENT DOCUMENTS

| | | | |
|---|---|---|---|
| 5,952,849 A | 9/1999 | Haigh | |
| 6,181,782 B1* | 1/2001 | Sonoda | 379/90.01 |
| 6,249,171 B1* | 6/2001 | Yaklin et al. | 327/382 |
| 6,389,063 B1* | 5/2002 | Kanekawa et al. | 375/222 |
| 6,404,780 B1* | 6/2002 | Laturell et al. | 370/510 |
| 6,928,158 B1* | 8/2005 | Fraisse et al. | 379/342 |
| 7,155,352 B2* | 12/2006 | Schoenborn | 702/64 |
| 7,577,223 B2* | 8/2009 | Alfano et al. | 375/362 |
| 7,629,813 B2* | 12/2009 | Proebsting et al. | 326/86 |
| 7,719,305 B2 | 5/2010 | Chen | |
| 7,737,871 B2* | 6/2010 | Leung et al. | 341/100 |
| 7,755,400 B2 | 7/2010 | Jordanger et al. | |
| 7,772,888 B2* | 8/2010 | Ciccarelli et al. | 326/86 |
| 7,912,210 B2* | 3/2011 | Fuehrer et al. | 379/399.01 |
| 8,076,793 B2* | 12/2011 | Robbins | 307/1 |
| 8,525,547 B2* | 9/2013 | Gaalaas et al. | 326/30 |
| 8,571,093 B1* | 10/2013 | Van de Beek | 375/219 |
| 8,629,714 B2* | 1/2014 | Ng et al. | 327/544 |
| 2004/0202204 A1* | 10/2004 | Dong et al. | 370/533 |
| 2010/0250820 A1* | 9/2010 | Gaalaas et al. | 710/305 |
| 2013/0195153 A1* | 8/2013 | Pimentel et al. | 375/219 |
| 2013/0278438 A1* | 10/2013 | Mueck | 340/870.16 |
| 2014/0028371 A1* | 1/2014 | Fang et al. | 327/333 |

OTHER PUBLICATIONS

Kugelstadt, T., "New digital, capacitive isolators raise the bar in high-performance," Texas Instruments, EE Times Design online date Apr. 6, 2010, pp. 1-5.

* cited by examiner

*Primary Examiner* — Thomas J Hiltunen
(74) *Attorney, Agent, or Firm* — Kenyon & Kenyon LLP

(57) ABSTRACT

A multi-channel isolation system has N+1 isolators for N channels of communication data. N of the isolators may transfer data signals across an isolation barrier, one for each of the N channels of data. An N+1$^{st}$ isolator transfers refresh signals representing state of the data signals on the N isolators. Receiver circuitry, therefore, may receive signals from the N isolation channels without risk for collision with refresh signals. If reception of the refresh signals becomes necessary, circuitry on a receive side of the isolator may switch over to the N+1$^{st}$ receive path to output state data contained in the refresh signals.

25 Claims, 8 Drawing Sheets

100

300

400

700

ISOLATOR-BASED TRANSMISSION SYSTEM WITH SIDE ISOLATOR CHANNEL FOR REFRESH SIGNALS

BACKGROUND

The present invention relates to isolator systems and, in particular, to management of refresh signaling in isolator systems.

Isolators are devices that exchange data signals between two galvanically isolated circuit systems. The circuit systems each operate in different voltage domains, which may include different source potentials and different grounds. Isolation devices may provide data exchange across an isolation barrier, which maintains the galvanic isolation. Typical isolation devices include micro-transformers, capacitors, magneto-resistors/giant magneto-resistors and opto-electronic devices.

A variety of signaling protocols have been developed for isolator systems. Many involve transmitting predetermined types of signals across the isolator device in response to predetermined events in an input signal. For example, rising and falling edges in a binary input signal might be transmitted respectively as a single pulse and a pair of pulses. Alternatively, the rising and falling edges in the input signal might be transmitted respectively as a pulse of positive polarity and a pulse of negative polarity. Additionally, many isolator systems transmit "refresh signals" across the isolator device when there has been no change in the input signal for a predetermined period of time. These refresh signals are transmitted across a common isolator device as the signal pulses that are generated in response to transitions in the input signal.

This signaling scheme can be problematic in some circumstances. When a refresh pulse is followed very quickly by a transition in an input signal, the resulting signal pattern can be misinterpreted at a receiver. Some isolator systems include provisions to guard against such collisions but increase propagation delay in signal transfer across an isolator device, which is disadvantageous. Accordingly, the inventor perceives a need in the art for an isolator system that protects against collisions between refresh signals and data-induced transmission signals in an isolator without associated penalties.

DETAILED DESCRIPTION

Embodiments of the present invention provide a multi-channel isolation system that comprises N+1 isolators for N channels of data transfer. N of the isolators may transfer data signals across an isolation barrier. An N+1$^{st}$ isolator transfers refresh signals representing state of the data signals on the N isolators. Receiver circuitry, therefore, may receive signals from the N isolation channels without risk for collision with refresh signals. If reception of the refresh signals becomes necessary, circuitry on a receive side of the isolator may switch over to the N+1$^{st}$ receive path to output state data contained in the refresh signals.

Figure 1:
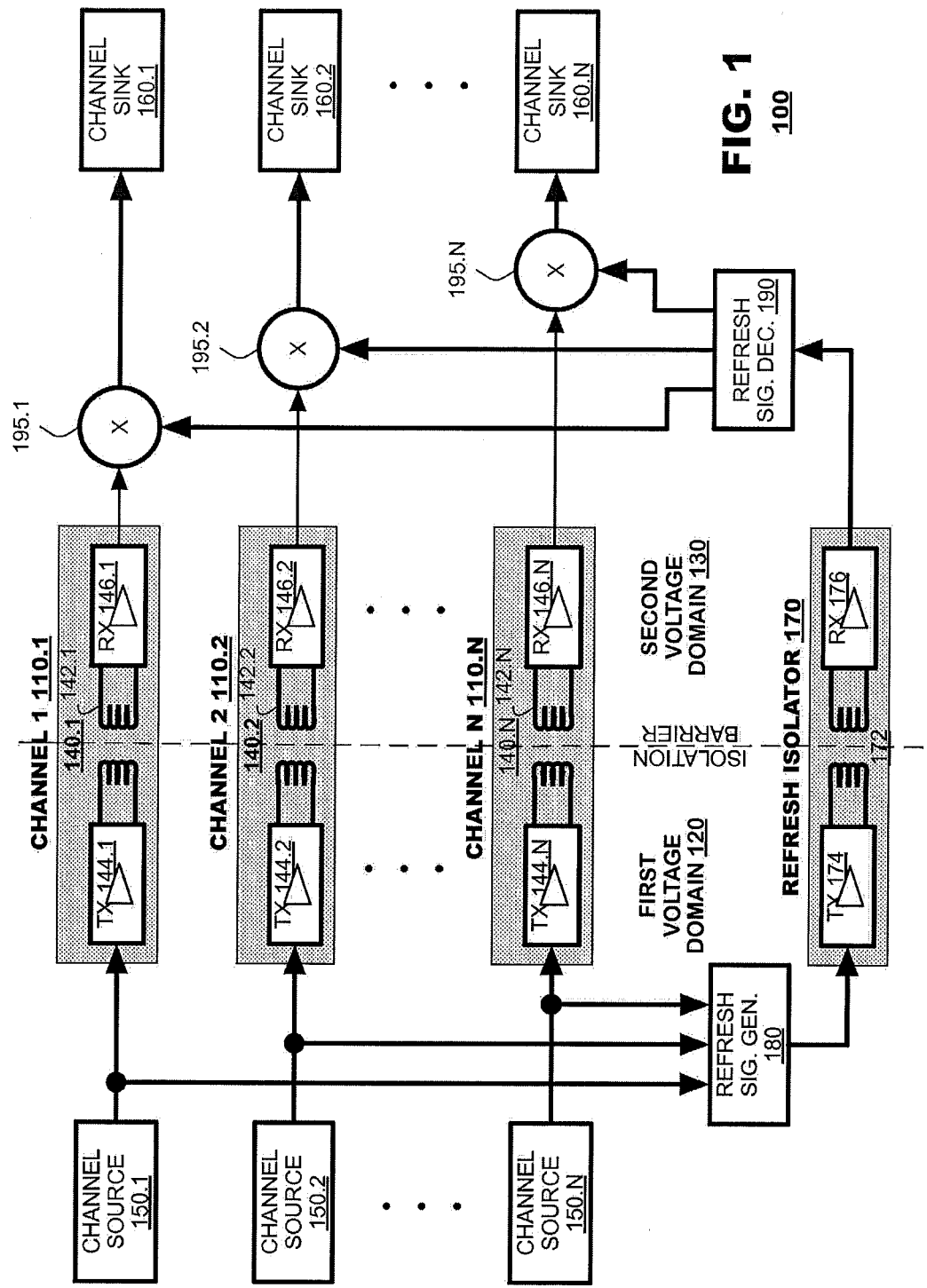
FIG. 1 is a block diagram of a multi-channel communication system according to an embodiment of the present invention.

FIG. 1 is a block diagram of a multi-channel communication system 100 according to an embodiment of the present invention. The system 100 may support a plurality of communication channels 110.1-110.N that transmit data from a first voltage domain 120 to a second voltage domain 130. The two voltage domains 120, 130 are galvanically isolated from each other by an isolation barrier. The communication channels 110.1-110.N may be formed by isolators 140.1-140.N, channel sources 150.1-150.N and channel sinks 160.1-160.N. The system 100 also may include a refresh channel formed by a refresh isolator 170, a refresh signal generator 180 and a refresh signal decoder 190. The FIG. 1 design colloquially is considered an "N+1 isolator design" because it includes N+1 isolators 140.1-140.N, 170 to support N channels of communication between the voltage domains 120, 130.

In the embodiment illustrated in FIG. 1, the isolators 140.1-140.N, 170 may support unidirectional communication from the first voltage domain 120 to the second voltage domain 130. The isolators 140.1-140.N, 170 may include respective isolator devices 142.1-142.N, 172 and may be formed as micro-transformers, capacitors, magneto-resistors/giant magneto-resistors, or optoelectronic devices. Each isolator 140.1-140.N, 170 also may include a transmitter 144.1-144.N, 174 provided in the first voltage domain 120 that drives signals to an associated isolator device 142.1-142.N, 172 in response to input signals received from a respective channel source 150.1-150.N or, in the case of the refresh channel 170, from the refresh signal generator 180. Each isolator 140.1-140.N, 170 also may include a receiver 146.1-146.N, 176 provided in the second voltage domain 130 to receive signals from an associated isolator device 142.1-142.N, 172 and generate output signals therefrom.

The channel sources 150.1-150.N represent circuits that provide data to be transmitted from the first voltage domain 120 to the second voltage domain 130. The channel sources 150.1-150.N may provide the data to transmitters 144.1-144.N within respective communication channel isolators 140.1-140.N, which may generate corresponding transmission signals to be applied to the isolator devices 142.1-142.N.

The channel sinks 160.1-160.N represent circuits that receive data transmitted from the first voltage domain 120 to the second voltage domain 130. The channel sinks 160.1-160.N may receive data output from the isolators 140.1-140.N via respective arbiters 195.1-195.N (discussed below). During operation, receivers 146.1-146.N within the isolators 140.1-140.N may generate output signals in response to signals received by them from the isolator devices 142.1-142.N. The output signals may be input to the channel sinks 160.1-160.N, which may generate output signals that replicate signals output by the channel sources 150.1-150.N.

The refresh channel 170, the refresh signal generator 180 and the refresh signal decoder 190 may manage communication of refresh signals within the system 100. The refresh signal generator 180 may monitor outputs of the channel sources 150.1-150.N and may store data representing the data of the sources' outputs in a register (not shown). The refresh signal generator 180 may output a data signal representing the state of the channel sources 150.1-150.N to the refresh isolator 170 at predetermined intervals. The refresh isolator 170 may transfer the refresh data signal to the refresh signal decoder 190, which may output state data respectively to arbiters 195.1-195.N associated with respective communication channels 110.1-110.N. The arbiters 195.1-195.N may merge data input to them from the channel isolators 140.1-140.N and the refresh signal decoder 190 and output merged data to the channel sinks 160.1-160.N.

Figure 2:
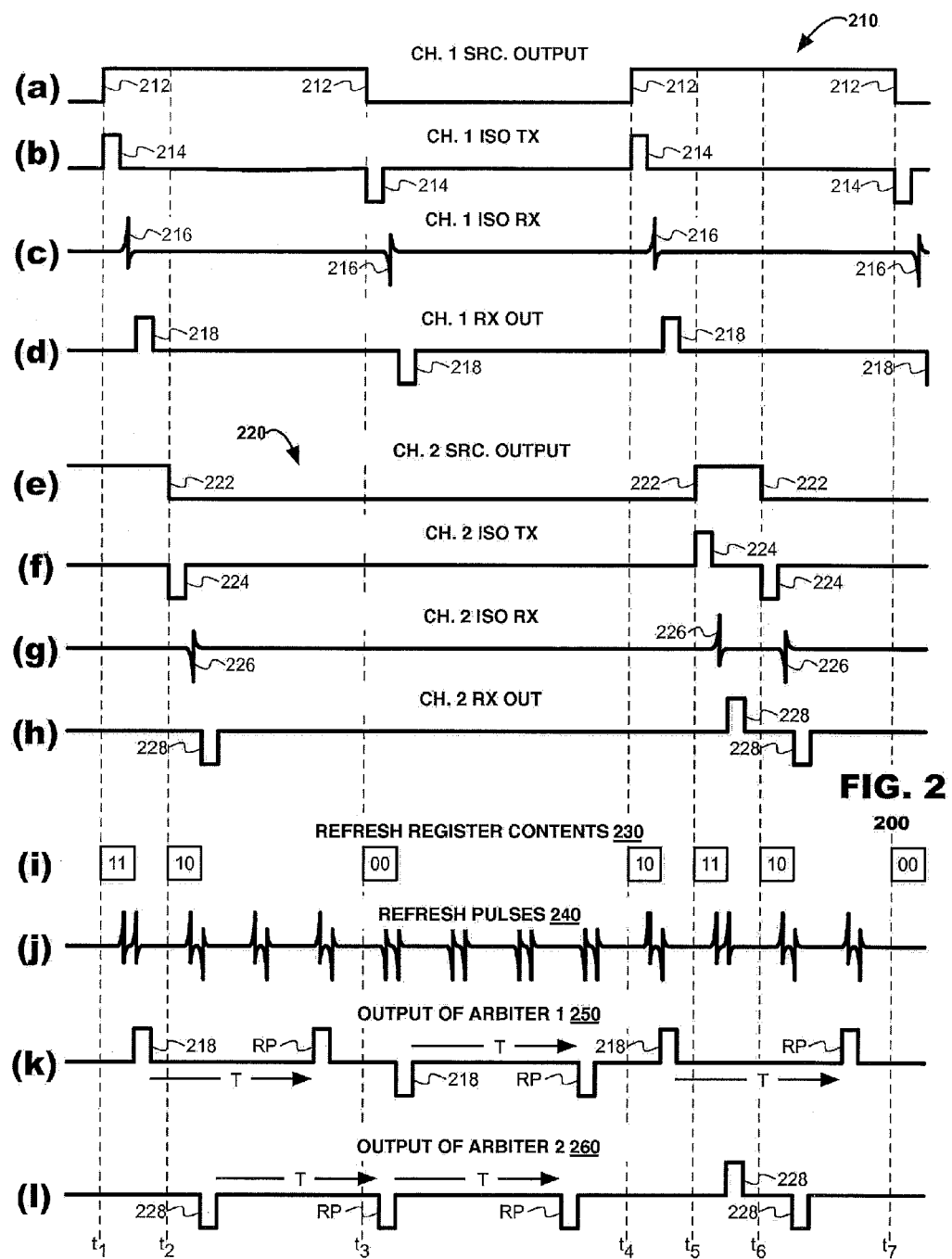
FIG. 2 illustrates exemplary data signals that may be exchanged between the first and second voltage domains in a multi-channel communication system.

FIG. 2 illustrates exemplary data signals that may be exchanged between the first and second voltage domains in the system 100 of FIG. 1. The example of FIG. 2 illustrates a two-channel configuration. In this example, graphs (a)-(d) and (k) represent signals communicated via a first channel of the system and graphs (e)-(h) and (l) represent signals communicated via a second channel of the system. Graphs (i) and (j) represent data and signals associated with the refresh channel.

Consider graphs (a) and (e). Graph (a) illustrates a data signal 210 that may be output by a first channel source (for example, source 150.1 in FIG. 1) to be transmitted to the second voltage domain 130. Likewise, graph (e) illustrates a data signal 220 that may be output by a second channel source 150.2 to be transmitted to the second voltage domain 130. In this example, state transitions 212, 222 occur at times t1, t2, t3, t4, t5, t6 and t7 in at least one of the data signals 210, 220.

FIG. 2 illustrates, in graphs (b)-(d), signals that may propagate through the first channel 110.1 in response to the data signal 210 of graph (a). Graph (b) illustrates an exemplary output of a transmitter 144.1, which may generate transmission pulses 214 in response to edges 212 in the data signal 210 from the channel source 150.1. The transmission pulses 214 may be applied to the isolator device 142.1, which may transform the pulses 214 as they appear at an output side of the isolator device 142.1, for example, as shown in graph (c). Graph (c) illustrates a transformation that may be introduced in a micro-transformer-based isolator; other isolator devices may introduce different transforms than illustrated. The pulses 216 from the isolator device 142.1 may be received by a receiver 146.1 within the first isolator 140.1. The receiver 146.1 may generate output pulses 218, which may be output from the isolator 140.1 to the arbiter 195.1 for the first channel 110.1, shown in graph (d).

Similarly, graphs (f)-(h) illustrate signals that may propagate through the second channel 110.2 in response to the data signal 220 shown in graph (e). Graph (f) illustrates an exemplary output of a transmitter 144.2, which may generate transmission pulses 224 in response to edges 222 in the data signal 220 from the channel source 150.2. The transmission pulses 224 may be applied to the isolator device 142.2, which may transform the pulses 224 as they appear at an output side of the isolator device 142.2, for example, as shown in graph (g). Graph (g) illustrates a transformation that may be introduced in a micro-transformer-based isolator; other isolator devices may introduce different transforms than illustrated. The pulses 226 from the isolator may be received by a receiver 146.2 within the second channel 110.2. The receiver 146.2 may generate output pulses 228, which may be output from the isolator 142.2 to the arbiter 195.2 for the second channel 110.2, shown in graph (h).

Graph (i) illustrates contents of a register within the refresh signal generator 180 at the times t1-t7. In the illustrated example, it is sufficient for the register to store two state bits, each bit representing state of the data signal on a respective channel. Thus, at time t1, when the data signal 210 transitions from low to high and the data signal 220 has a high value, the register may store a binary value "11". At time t2, the data signal 220 may transition from a high value to a low value but the data signal 210 may remain high; the register may be updated to store a binary value "10." At time t3, the data signal 210 also may transition from a high value to a low value and the data signal 220 may remain unchanged; the register may be update to store a binary value "00." The register's contents may be updated on each new transition of the data signals 210, 220 to store data that reflects those signals' current state, such as the examples shown at times t4, t5, t6 and t7.

Graph (j) illustrates exemplary refresh signals that may be transmitted across the refresh isolator 170 based on the data stored by the refresh signal generator 180. The contents of the refresh signal generator's register may be transmitted across the refresh isolator 170 at predetermined update intervals, shown as pulses 240. These pulses may be decoded by the refresh signal decoder 190 and stored within a register at the decoder 190 for use by the arbiters 195.1, 195.2 as needed. Graph (j) illustrates pulses that may be input to the receiver 176 of the refresh channel 170. Signals output from the refresh signal generator 180 and transmitter 174 are omitted from FIG. 2 for clarity.

Graphs (k) and (l) illustrate signals that may be output from the arbiters 195.1 and 195.2, respectively. The arbiters 195.1, 195.2 may output signals to the channel sinks 160.1, 160.2 representing received signals that are generated by the isolator receivers 146.1, 146.2 and state data from the refresh signal decoder 190. For example, as shown in graph (k), the first arbiter 195.1 may output a signal that includes pulses 218 that are received from the isolator receiver 146.1 and refresh pulses generated from the refresh signal decoder 190. Similarly, graph (l) shows that the second arbiter 195.2 may output a signal that includes pulses 228 that are received from its associated isolator receiver 146.2 and refresh pulses generated from data received from the refresh signal decoder 190. Each arbiter 195.1, 195.2 may include logic that generates a refresh pulse after a predetermined time of inactivity (shown at T) elapses in the respective isolator's output, called a "refresh interval" herein.

Thus, as shown, the isolator system 100 of the foregoing embodiment transmits N channels of data signals across N communication channels 110.1-110.N and transmits refresh signals across an additional, N+1$^{st}$ refresh isolator 170. In this manner, the isolator design avoids "collision" events that might occur if refresh pulses were transmitted in close proximity to state transitions in a source data signal. In other designs, where data signals and their associated refresh pulses are transmitted across a common isolator, such collisions could cause signal conditions that may induce decoding errors at a receiver device. Thus, the N+1 isolator design of the FIG. 1 embodiment contributes to improved operation by protecting against such decoding errors.

The example of FIG. 2 illustrates data and refresh signals transmitted through the isolators as transmission pulses whose polarity is modulated to represent signal content. The principles of the present invention, however, are not so limited. Signaling may conform to other protocols. For example, as mentioned earlier, data signals may be transmitted as a single pulse or pair of pulses to represent signal content. Alternatively, data signals may be transmitted across the isolators as frequency-modulated signals. Similarly, although FIG. 2 illustrates positive refresh pulses representing "1" values and negative refresh pulses representing "0" values, signaling across the refresh isolator may vary from the protocol illustrated in FIG. 2. For example, refresh signals may be coded as pulse pairs, frequency-modulated signals or alternating pulses (e.g., "11" might be coded as a positive pulse followed by a negative pulse). In a further embodiment, the refresh data may be processed as a data word and transmitted as such. For example, the refresh data may be transmitted as pulses representing an N-bit count value. Other signaling formats also are permissible consistent with the spirit of the present invention.

The example of FIG. 2 illustrates operation in an exemplary two channel system (e.g., N=2). In practice, an isolator system may have more than two channels. Indeed, implementations in which N because the "cost" of the N+1$^{st}$ isolator, when considered in terms of circuit area and manufacturing complexity, likely will be offset by improved performance in data throughput.

Figure 3:
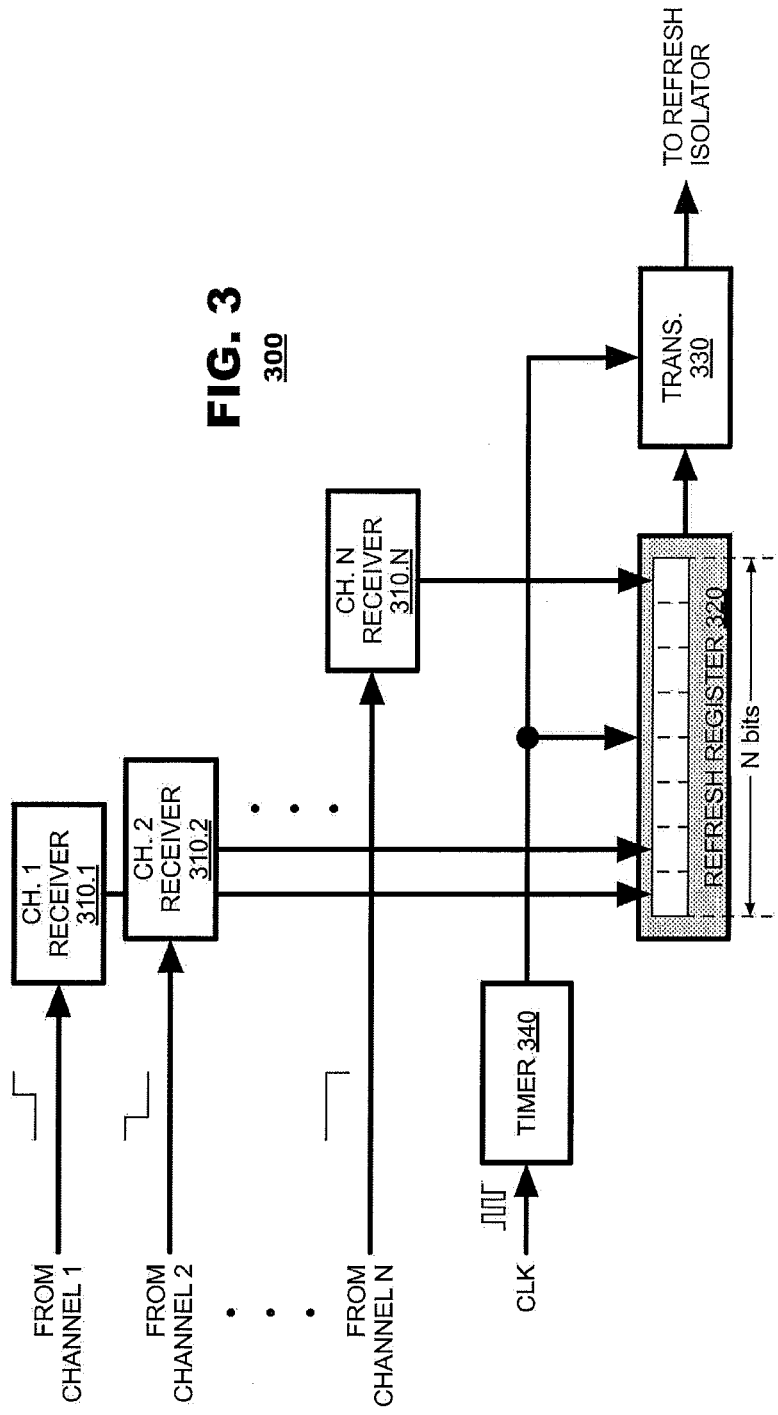
FIG. 3 is a functional block diagram of a refresh signal generator according to an embodiment of the present invention.

FIG. 3 is a functional block diagram of a refresh signal generator 300 according to an embodiment of the present invention. The refresh signal generator 300 may include a plurality of channel receivers 310.1-310.N, a refresh register 320, a transmitter 330 and a timer 340. The channel receivers 310.1-310.N each may have an input coupled to a respective channel source (not shown) and an output coupled to the refresh register 320. The register 320 may be an N-bit register, having a bit position dedicated to each of the N channels. The channel receivers 310.1-310.N may store data in associated bit positions of the refresh register 320 representing state of data output from their respective channel sources.

The refresh register 320 may generate a serial output signal representing contents of the register. The transmitter 330 may generate transmission signals to the refresh isolator representing the register's output. Timing of the refresh signals may be governed by a self-resetting timer 340, which define timing intervals for the register 320 to output its contents to the transmitter 330.

During operation, the channel receivers 310.1-310.N may monitor outputs from the respective channels and maintain the respective status bits of the refresh register current (for example, as shown in FIG. 2 ($i$)). Thus, when changes in state occur on the channel outputs, the receivers 310.1-310.N may record corresponding changes in values within the status register 320.

The timer 340 may define periods for transmission of refresh data through the refresh isolator (not shown). Each time the timer 340 elapses, the refresh register 320 may output its contents to the transmitter 330 and the transmitter 330 may transmit appropriate signals to the refresh isolator. Thus, the refresh signal generator 300 may send multi-bit transmission bursts to the second voltage domain, where each bit position represents the state of one of the isolator channels.

Figure 4:
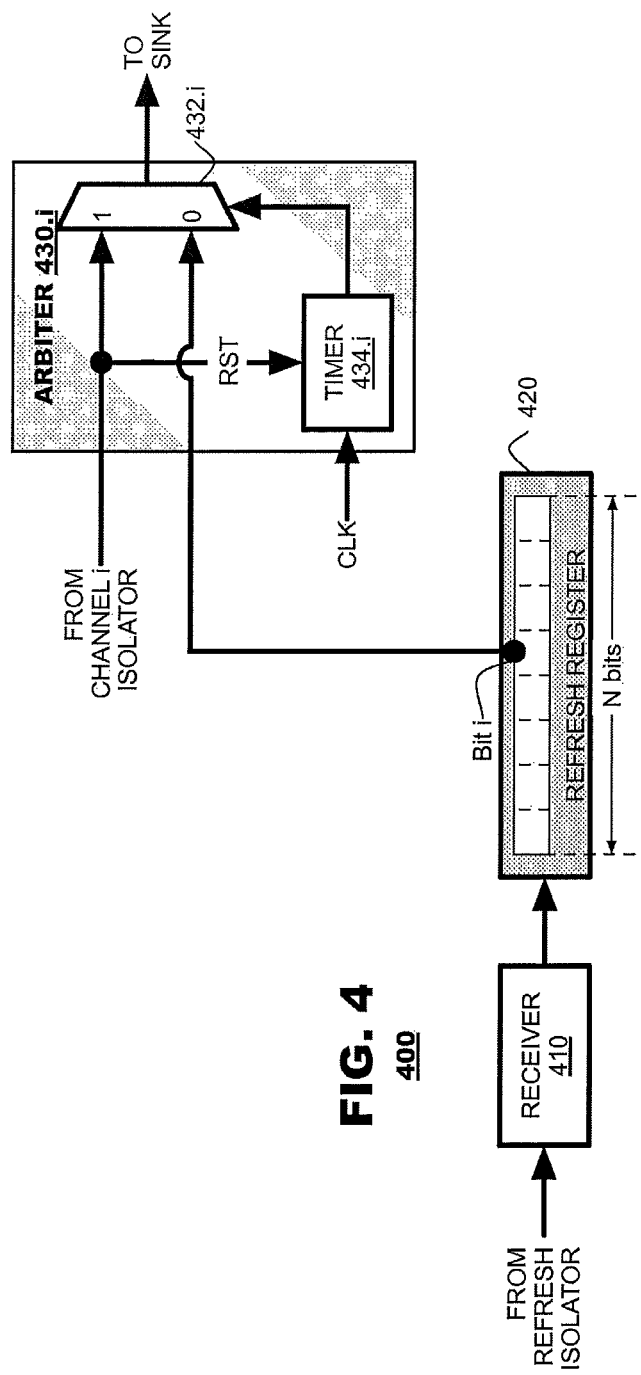
FIG. 4 is a functional block diagram of a refresh signal decoder according to an embodiment of the present invention.

FIG. 4 is a functional block diagram of a refresh signal decoder 400 that includes a receiver 410 and a refresh register 420. FIG. 4 also illustrates a functional block diagram of an arbiter 430.$i$ for one of the channels. The receiver 410 may receive signals from the refresh signal isolator (for example, as shown in FIG. 2($j$)) and generate digital data therefrom, which may be stored in the refresh register 420. After reception and decoding, the refresh register 420 of the refresh signal decoder 400 ideally will have identical content as the refresh register 320 of the refresh signal generator 300 (FIG. 3).

The arbiters 430.$i$ may include a multiplexer 432.$i$ and a timer 434.$i$. The multiplexer 432.$i$ may have a pair of inputs. A first input may receive signals from the channel isolator (FIG. 1) for the channel to which the arbiter 430.$i$ is assigned. A second input may receive signals from the bit position of the refresh register 420 that corresponds to the channel to which the arbiter 430.$i$ is assigned. An output of the multiplexer 432.$i$ may be coupled to the channel sink (not shown) of the channel.

The timer 434.$i$ may have an input coupled to a driving clock and a reset input coupled to the output of the isolator. The timer's output may be input to the multiplexer 432.$i$ as a switch control signal. The timer may be reset by signal activity on the channel isolator's output. In the embodiment illustrated in FIG. 4, when the timer 434.$i$ times out, it may generate an output to the multiplexer 432.$i$ that causes the multiplexer 432.$i$ to output signals input to the arbiter 430.$i$ from the refresh register 420. At all other times, the multiplexer 432.$i$ may output signals from the channel isolator.

During operation, the multiplexer 432.$i$ may output signals from the channel isolator to the channel signal. The timer 434.$i$ may reset each time there is signal activity from the channel isolator. Thus, if new signal activity is presented to the arbiter 430.$i$ by the channel isolator at a sufficiently high rate, the timer 434.$i$ may never expire and the multiplexer 432.$i$ may remain clamped on the output of the channel isolator.

If signal activity remains dormant, however, for a period of time corresponding to the refresh interval, the timer 434.$i$ may time out and the output of the timer 434.$i$ may cause the multiplexer 432.$i$ to switch inputs to the input received from the refresh register 420. The timer 434.$i$ may reset again after it times out (control signals not shown) and the timer's output may cause the multiplexer 432.$i$ to return to the input from the channel isolator.

In this manner, each arbiter 430.$i$ may refresh output signals that it provides to the channel sinks (not shown) independently of the operation of other arbiters. If arbiter 430.$i$, for example, experiences signal inactivity which causes the arbiter 430.$i$ to issue a refresh signal, it is possible that arbiters (not shown) of other channels would not need to issue refresh signals due to a high rate of signal activity. This phenomenon is illustrated in the example of FIGS. 2($k$) and 2($l$).

Figure 5:
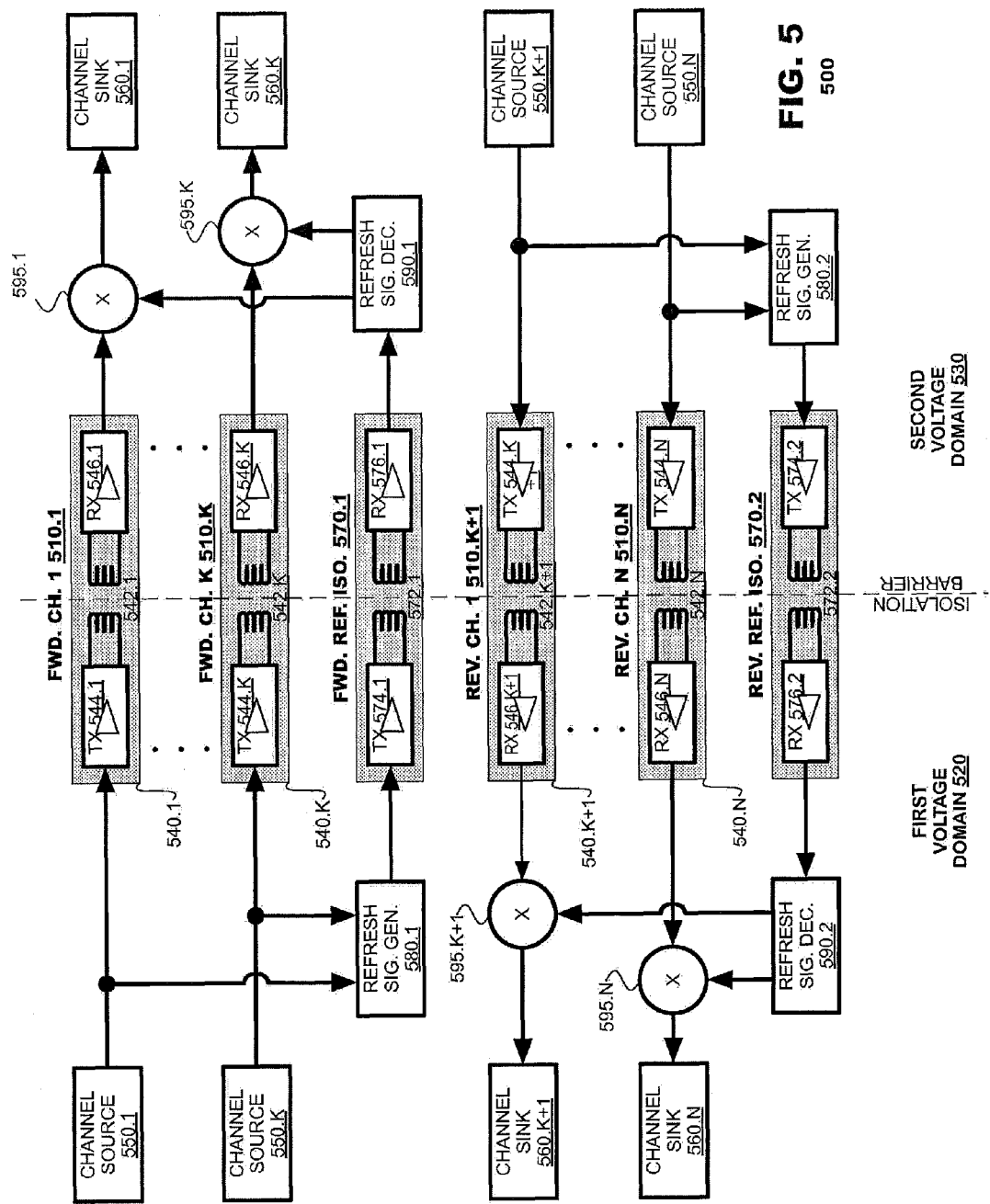
FIG. 5 is a block diagram of an isolator system according to another embodiment of the present invention.

Although the FIG. 1 embodiment illustrates unidirectional transmission of data, from a first voltage domain 120 to a second voltage domain 130, the principles of the present invention are not so limited. FIG. 5 illustrates another embodiment of the present invention that supports bi-directional transmission of data. In this example, again, there are N channels 510.1-510.N in the system 500 but K of the channels 510.1-510.K transmit data from a first voltage domain 520 to a second voltage domain 530 (called a "forward" direction, for convenience) and the remaining channels 510.K+1-510.N transmit data from the second voltage domain 530 to the first voltage domain 520 (called a "reverse" direction). The two domains 520, 530 are galvanically isolated from each other by an isolation barrier. The communication channels 510.1-510.N may be formed of isolators 540.1-540.N, channel sources 550.1-550.N and channel sinks 560.1-560.N. Additionally, the system 500 may include a pair of refresh isolators 570.1, 570.2, each to transmit state data in a respective direction. The embodiment illustrated in FIG. 5, may be considered an "N+2" design because the system 500 includes N+2 isolators to support N data channels.

In the embodiment illustrated in FIG. 5, the isolators 540.1-540.N, 570.1, 570.2 each support unidirectional communication in a respective direction between the voltage domains 520, 530. The isolators 540.1-540.N, 570.1-570.2 each may include an isolator device 542.1-542.N, 572.1-572.2, a transmitter 544.1-544.N, 574.1-574.2 and a receiver 546.1-546.N, 576.1-576.2. The isolator devices 542.1-542.N, 572.1-572.2 may be formed as micro-transformers (shown), capacitors, magneto-resistors/giant magneto-resistors, or optoelectronic devices. Each channel transmitter 542.1-542.N, may receive input signals from an associated channel source 550.1-550.N and may output transmission signals to an associated isolator device 542.1-542.N. Each channel receiver 544.1-544.N may receive signals from an associated isolator device 542.1-542.N and may output recovered data signals to an associated channel sink 560.1-560.N via an arbiter 595.1-595.N.

The channel sources 550.1-550.N represent circuits that provide data to be transmitted between the first voltage domain 520 and the second voltage domain 530. Similarly, the channel sinks 560.1-560.N represent circuits that receive data from channel sources 550.1-550.N via the isolators 540.1-540.N. The channel sinks 560.1-560.N may receive data output from the isolators 540.1-540.N via respective arbiters 595.1-595.N (discussed below).

The system 500 may include refresh isolators 570.1, 570.2 and associated refresh signal generators 580.1, 580.2 and refresh signal decoders 590.1, 590.2. One set of the refresh signal generators 580.1, refresh isolators 570.1 and refresh signal decoders 590.1 may communicate refresh signals in the forward direction. A second set of the refresh signal generators 580.2, refresh isolators 570.2 and refresh signal decoders 590.2 may communicate refresh signals in the reverse direction. Each refresh signal generator 580.1, 580.2 may monitor outputs of its associated channel sources 550.1-550.K and 550.K+1-550.N and may store data representing the data of the sources' outputs in a register (not shown). The refresh signal generators 580.1, 580.2 may output a data signal representing the state of the respective channel sources 550.1-550.K, 550.K+1-550.N to a respective refresh isolator 570.1, 570.2 at predetermined intervals. The refresh isolators 570.1, 570.2 may transfer the refresh data signals to respective refresh signal decoders 590.1, 590.2, which may output state data respectively to arbiters 595.1-595.N associated with their isolation channels 510.1-510.N. The arbiters 595.1-595.N may merge data input to them from the isolation channel 510.1-510.N and refresh signal decoders 590.1, 590.2 and output merged data to the channel sinks 560.1-560.N.

The isolator system 500 illustrated in FIG. 5 essentially represents duplication of the FIG. 1 embodiment: two "N+1" isolator systems, where a first such system (channels 1-K) supports communication in the forward direction and a second such system (channels K+1-N) support communication in the reverse direction. Thus, operation of the FIG. 5 embodiment may proceed as discussed above in connection with FIG. 2. Moreover, the refresh signal generators 580.1, 580.2, refresh signal decoders 590.1, 590.2 and arbiters 595.1-595.N may operate as discussed in connection with FIGS. 3 and 4.

Figure 6:
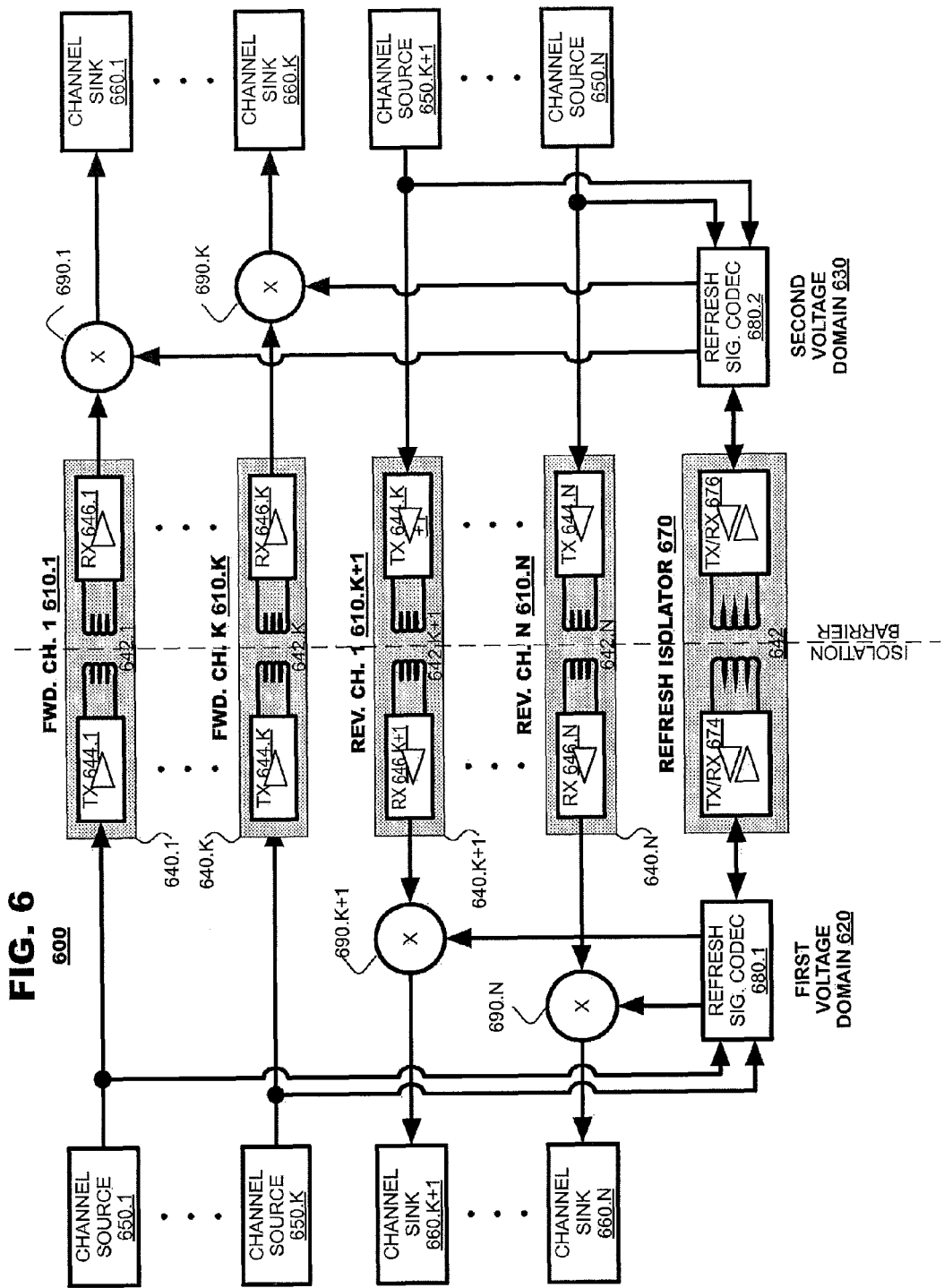
FIG. 6 is a block diagram of an isolator system according to a further embodiment of the present invention.

FIG. 6 illustrates an isolator system 600 according to another embodiment of the present invention. This embodiment supports bidirectional communication of data using a single refresh isolator and, therefore, it may be considered an "N+1" isolator design. In this embodiment, there are N channels 610.1-610.N in the system 600 but K of the channels 610.1-610.K transmit data from a first voltage domain 620 to a second voltage domain 630 (again, called a "forward" direction, for convenience) and the remaining channels 610.K+1-610.N transmit data from the second voltage domain 630 to the first voltage domain 620 (a "reverse" direction). The two domains 620, 630 are galvanically isolated from each other by an isolation barrier. The communication channels 610.1-610.N may be formed of isolators 640.1-640.N, channel sources 650.1-650.N and channel sinks 660.1-660.N. The system 600 also may include a refresh isolator 670, coupled to refresh signal coder/decoders 680.1, 680.2 ("codecs") respectively provided in the first voltage domain 620 and second voltage domain 630.

In the embodiment illustrated in FIG. 6, the isolators 640.1-640.N for the communication channels 610.1-610.N each support unidirectional communication in a respective direction between the voltage domains 620, 630. The isolators 640.1-640.N each may include an isolator device 642.1-642.N, a transmitter 644.1-644.N, and a receiver 646.1-646.N. The isolators 640.1-640.N may be formed as microtransformers (shown), capacitors, magneto-resistors/giant magneto-resistors, or optoelectronic devices. Each channel transmitter 644.1-644.N, may receive input signals from an associated channel source 650.1-650.N and may output transmission signals to an associated isolator device 642.1-642.N. Each isolator receiver 644.1-644.N may receive signals from an associated isolator device 642.1-642.N and may output recovered data signals to an associated channel sink 660.1-660.N via an arbiter 690.1-690.N.

The channel sources 650.1-650.N represent circuits that provide data to be transmitted between the first voltage domain 620 and the second voltage domain 630. Similarly, the channel sinks 660.1-660.N represent circuits that receive data from channel sources 650.1-650.N via the isolators 640.1-640.N. The channel sinks 660.1-660.N may receive data output from the isolators 640.1-640.N via respective arbiters 690.1-690.N.

The system 600 may exchange refresh data in both directions across the isolation barrier via the refresh signal codec 680.1, 680.2 and refresh isolator 670. The refresh isolator may include an isolator device 672 and a pair of transceivers 674, 676 provided in the first voltage domain or the second voltage domain respectively. The isolator device 672 may be provided of a type that is appropriate for bidirectional communication of data, for example, a micro-transformer or a capacitor. The transceivers 674, 676 each may receive signals from an associated refresh signal codec 680.1, 680.2 and transmit appropriate transmission signals to the isolator device 672. The transceivers 674, 676 also may receive signals from the isolator device 672 and may provide recovered data signals to an associated refresh signal codec 680.1, 680.2. In this regard, the refresh signal codecs 680.1, 680.2 represent mergers of the refresh signal generators and refresh signal decoders of the prior embodiments.

Each refresh signal codec 680.1, 680.2 may monitor outputs of its associated channel sources 650.1-650.K and 650.K+1-650.N and may store data representing the data of the sources' outputs in a register (not shown). At predetermined timing intervals, the refresh signal codecs 680.1, 680.2 may output data signals representing the state of the respective channel sources 650.1-650.K, 650.K+1-650.N to the refresh isolator 670. The refresh isolator 670 may transfer the refresh data signals across the isolation barrier to a counterpart refresh signal codec 680.2, 680.1, which may store corresponding state data in their own registers (also not shown). The refresh signal codecs 680.2, 680.1 may output state data of the channels 1-N to arbiters 690.1-690.N, which may merge data from the isolation channels 610.1-610.N and from refresh signal codecs 680.2, 680.1 and output merged data to the channel sinks 660.1-660.N.

Operation of the refresh signal codecs 680.1, 680.2 may be synchronized with each other to avoid transmitting refresh state data in opposite directions simultaneously. Thus, the refresh signal codecs 680.1, 680.2 may operate in a "ping pong" fashion in which a first refresh signal codec 680.1 transmits data across the isolator, then waits for refresh signal data from a second refresh signal codec 680.2.

Figure 7:
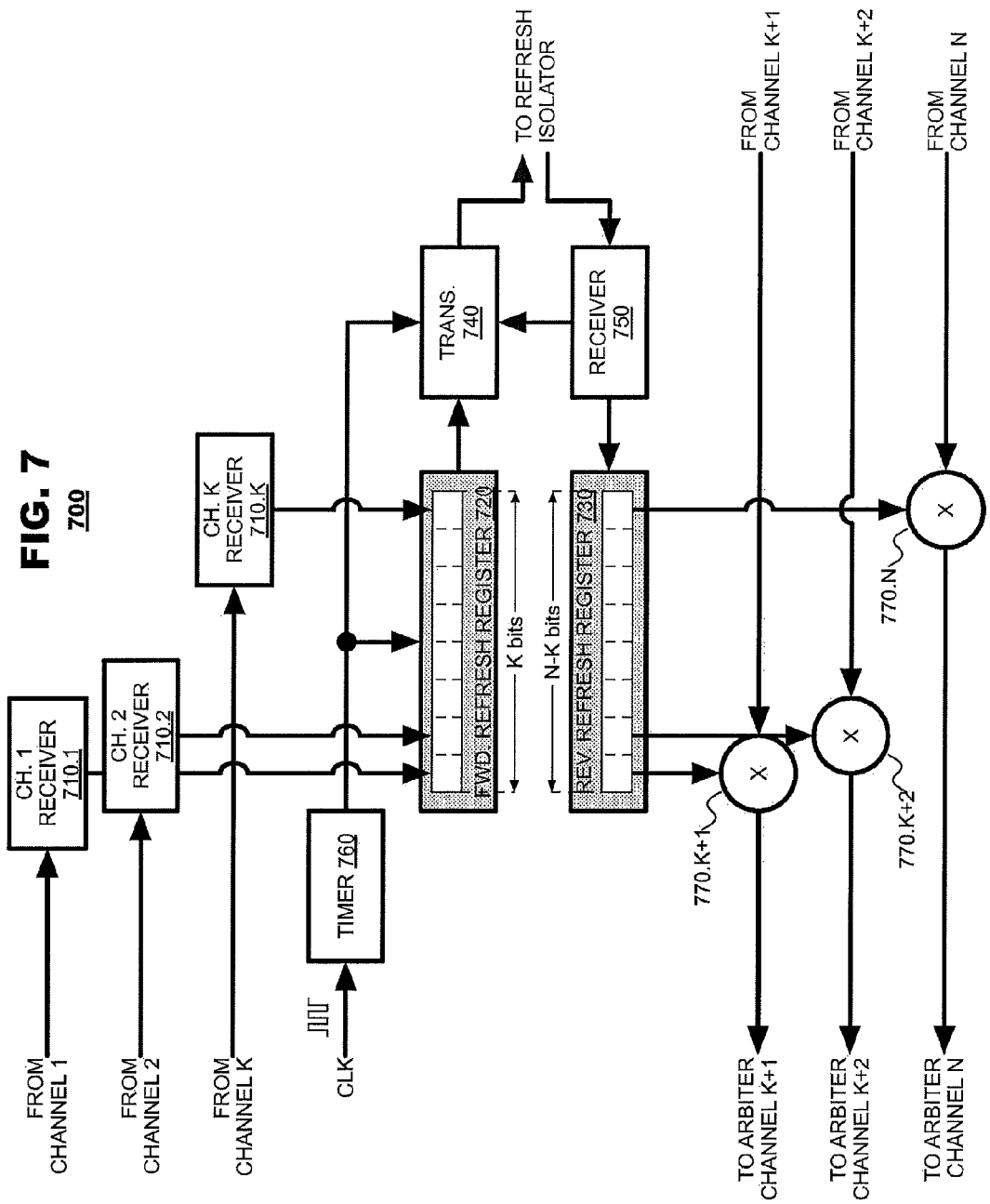
FIG. 7 is a functional block diagram of refresh signal codec according to an embodiment of the present invention.

FIG. 7 is a functional block diagram of refresh signal codec 700 according to an embodiment of the present invention. The codec 700 merges elements of the refresh signal generator (FIG. 3) and refresh signal decoder (FIG. 4) of the foregoing embodiments. Thus, the refresh signal codec 700 may include a plurality of receivers 710.1-710.K, a pair of refresh registers 720, 730, a transmitter 740, a receiver 750 and a timer 760. In the example of FIG. 7, the refresh signal codec 700 is shown for transmission of refresh signals in the forward direction and reception of refresh signals in the reverse direction. Thus, for convenience, the refresh registers 720, 730 are labeled the "forward refresh register" and "reverse refresh register" respectively.

The refresh signal codec 700 may have as many channel receivers 710.1-710.K as are transmitting in the forward direction. The channel receivers 710.1-710.N may have an input coupled to a respective channel source (not shown) and an output coupled to the forward refresh register 720. The forward refresh register 720 may be a K-bit register, having a bit position dedicated to each of the K channels that are transmitting in the forward directions. The channel receivers 710.1-710.K may store data in an associated bit position of the forward refresh register 720 representing state of the output state from their associated channels.

The forward refresh register 720 may generate a serial output signal representing contents of the register. The transmitter 740 may generate transmission signals to the refresh isolator representing the register's output. Timing of the refresh signals may be governed by a self-resetting timer 760 and by an enablement signal from a receiver 750. The timer 760 may define timing intervals for the register 720 to output its contents to the transmitter 740 and the receiver 750 may delay initiation of a given transmission interval if it is sensing that refresh signals are being received from the isolator.

The receiver 750 may receive signals from the refresh signal isolator (for example, as shown in FIG. 2(j)) and generate digital data therefrom, which may be stored in the reverse refresh register 730. After reception and decoding, the reverse refresh register 730 ideally will have identical content as a refresh register of the refresh signal codec (not shown) on an opposite side of the isolation barrier (ex., 680.2 in FIG. 6).

FIG. 7 also illustrates provision of arbiters 770.K+1-770.N for channels in the reverse direction. As indicated, the arbiters 770.K+1-770.N may merge refresh state data with data received from the communication isolators (not shown) based on activity of the signals received on the respective communication isolators. In an embodiment, the arbiters 770.K+1-770.N may be provisioned as illustrated in FIG. 4.

During operation, the channel receivers 710.1-710.N may monitor outputs from the respective channels and maintain the respective status bits of the refresh register current. Thus, when changes in state occur on the channel outputs, the receivers 710.1-710.N may record corresponding changes in values within the forward refresh register 720.

The timer 760 may define periods for transmission of refresh data through the refresh isolator (not shown). Each time the timer 760 elapses, the forward refresh register 720 may output its contents to the transmitter 740 and the transmitter 740 may transmit appropriate signals to the refresh isolator. An exception may occur if the timer 760 elapses and attempts to initiate transmission at a time when the isolator is being used to transmit refresh signals in the reverse direction. When refresh signals are being received by the receiver 750, the receiver 750 may output a control signal to inhibit transmission of data by the transmitter 740. After reception concludes, the receiver 750 may release the control signal and transmission may occur thereafter. Release of the control signal also may be input to the timer 760 to reset it (control line not shown) in order to keep transmission and reception appropriately separated in time.

The embodiment illustrated in FIG. 7 may be applied as a refresh signal codec 680.1 in FIG. 6. The refresh signal codec 680.2 may be similarly provisioned. In such an embodiment, the refresh signal codec may have N-K channel receivers 710 and a first refresh register 720, which would support transmission of refresh signals in the reverse direction, may be sized to accommodate N-K bits. Similarly, the second refresh register 730 would support reception of refresh signals in the forward direct, may be sized to accommodate K bits and would output refresh state data to K arbiters 770. In all other regards, however, the architecture of the refresh signal codec 680.2 (FIG. 6) may be as illustrated in FIG. 7.

Figure 8A:
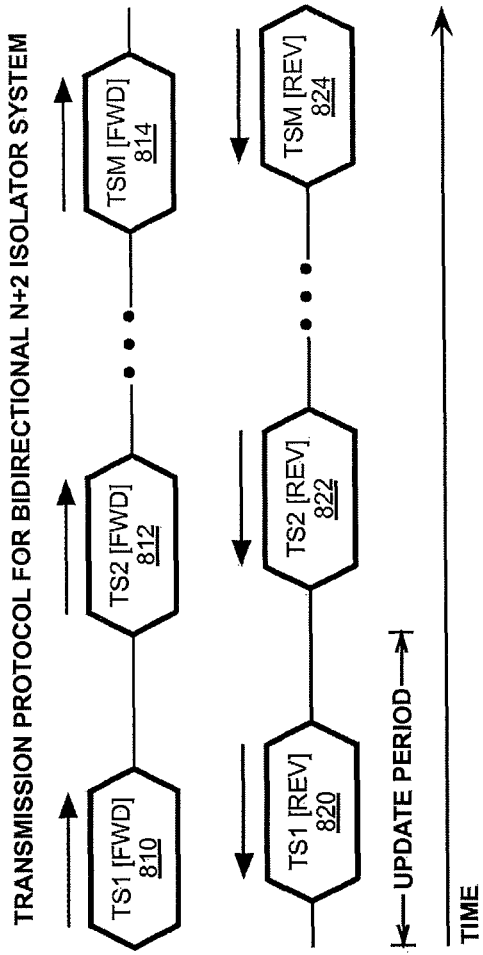
FIGS. 8A and 8B are timing diagrams illustrating operation of refresh isolators according to various embodiments of the present invention.
Figure 8B:
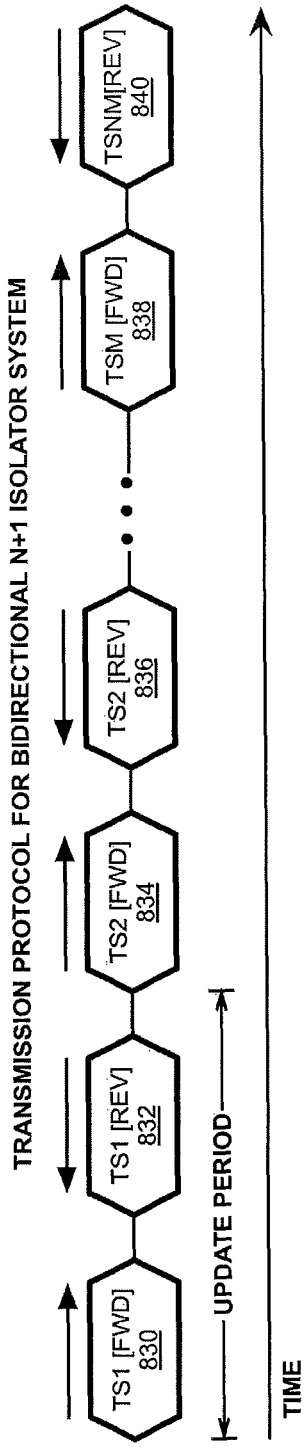

FIGS. 8A and 8B are timing diagrams illustrating operation of refresh isolator(s) in the N+2 and N+1 cases of FIGS. 5 and 6 respectively. FIG. 8A illustrates an example where refresh signals are transmitted in the forward direction and reverse direction over a pair of independent isolators. In this case, transmissions are represented as occurring in time slots in each direction. Transmission time slots 810, 812, 814 in the forward direction may occur asynchronously with respect to transmission time slots 820, 822, 824 in the reverse direction. The transmissions may overlap in time as illustrated in FIG. 8A or not. Timing of the time slots 810-814 and 820-824 in each direction may be governed by independent timers in the respective refresh signal generators (FIG. 6) and likely will define slightly different refresh periods due to operational differences in each voltage domain.

FIG. 8B illustrates transmission of time slots in an N+1 system as in FIG. 6. In this embodiment, the refresh signal codecs of the two voltage domains 620, 630 share a common refresh isolator. The two refresh signal codecs 680.1, 680.2 may coordinate transmission of refresh time slots 830, 832, . . . , 840 to ensure those time slots do not overlap. Thus, FIG. 8B illustrates time slots 830, 834, 838, representing refresh transmission in the forward direction, interspersed with times slots 832, 836, 840, representing refresh transmissions in the reverse direction. Although the time slots 830, 832, . . . , 840 are illustrated as spaced equally from each other in time, such operation need not always occur.

Several embodiments of the invention are specifically illustrated and/or described herein. However, it will be appreciated that modifications and variations of the invention are covered by the above teachings and within the purview of the appended claims without departing from the spirit and intended scope of the invention.

I claim:

1. A system, comprising:
 a plurality (N) of isolators to transfer data signals across an isolation barrier, and
 an N+1$^{st}$ isolator to transfer refresh signals identifying a state of the data signals on the N isolators, wherein the data signals and refresh signals are transmitted in a common direction across the isolation barrier.

2. The system of claim 1, wherein
 the N isolation channels transfer data from a first side of the isolation barrier to a second side of the isolation barrier, and
 the refresh signals are transmitted from the first side of the isolation barrier to a second side of the isolation barrier.

3. The system of claim 1, wherein
 a first portion of the N isolation channels transfer data in a first direction across the isolation barrier,
 a remaining portion of the N isolation channels transfer data in a second direction across the isolation barrier.

4. The system of claim 3, wherein the refresh signals are transmitted across the isolation barrier in transmissions that alternate between the first and second directions.

5. The system of claim 3, wherein the refresh signal transmissions in the first direction contain state data of the first portion of isolation channels and the refresh signal transmissions in the second direction contain state data of the remaining portion of isolation channels.

6. The system of claim 1, wherein the refresh signals are transmitted in time slots having at least N pulses, each pulse representing state of a respective data signal.

7. The system of claim 1, further comprising:
a plurality of channel sources, each providing a data signal for a respective isolator, and
a refresh signal generator to generate the refresh signals based on outputs from the channel sources.

8. The system of claim 7, wherein the refresh signal generator transfers refresh signals at predetermined timing intervals.

9. The system of claim 7, wherein the refresh signal generator comprises an N bit register to store state data of the data signals.

10. The system of claim 7, further comprising transmitters, provided between the isolators and their respective channel sources, to generate transmission pulses in response to edges in the respective data signal.

11. The system of claim 1, further comprising:
a plurality of arbiters, each having an input coupled to a respective isolator, and
a refresh signal decoder to generate state data from refresh signals received from the $N+1^{st}$ isolator, and to output state data of each channel to its associated arbiter.

12. The system of claim 11, wherein the arbiters output data representing the input state data after predetermined time(s) of inactivity on the data signal received from the respective isolator.

13. The system of claim 11, further comprising receivers, each coupled between an isolator and a respective arbiter, to generate data signals from signals received via the isolator.

14. A method comprising:
transmitting data signals across an isolation barrier in a plurality of isolation channels, each isolation channel comprising an isolator device,
periodically, transmitting refresh signals identifying a state of the data signals across an additional isolator device, wherein the data signals and the refresh signals are transmitted in a common direction across the isolation barrier.

15. The method of claim 14, further comprising, on a receive side of the isolation barrier:
receiving data signals from the isolators of the isolation channels,
outputting the received data signals to channel sinks of the isolation channels,
when data signals from one of the isolators is inactive for a predetermined time, outputting state data to the isolator's associated channel sink, the state data generated from the refresh signals.

16. The method of claim 14, further comprising, on a transmit side of the isolation barrier:
monitoring output from a plurality of channel sources, each associated with one of the isolation channels,
when an output of one of the channel sources changes, storing data representing the source's output in a refresh register, wherein the refresh signals are generated from the refresh register.

17. A system, comprising:
a plurality (N) of isolators to transfer data signals across an isolation barrier,
an $N+1^{st}$ isolator to transfer refresh signals identifying a state of data signals transmitted from a first side of the isolation barrier to a second side of the isolation barrier, and
an $N+2^{nd}$ isolator to transfer refresh signals identifying a state of data signals transmitted from a second side of the isolation barrier to a first side of the isolation barrier,
wherein the data signals and refresh signals are transmitted in a common direction across the isolation barrier.

18. The system of claim 17, further comprising:
a plurality of channel sources provided on the first side of the isolation barrier, each providing a data signal for a respective isolator, and
a refresh signal generator provided on the first side of the isolation barrier to provide the refresh signals to the $N+1^{st}$ isolator based on outputs from the channel sources.

19. The system of claim 18, wherein the refresh signal generator transfers refresh signals at predetermined timing intervals.

20. The system of claim 18, further comprising:
a plurality of second channel sources provided on the second side of the isolation barrier, each providing a data signal for a respective isolator, and
a refresh signal generator provided on the second side of the isolation barrier to provide the refresh signals to the $N+2^{nd}$ isolator based on outputs from the second channel sources.

21. The system of claim 18, wherein the refresh signal generator comprises:
a first register to store state data representing outputs from the channel sources
a second register to store state data representing the refresh signals received from the $N+2^{nd}$ isolator.

22. The system of claim 18, further comprising transmitters, provided between the isolators and their respective channel sources, to generate transmission pulses in response to edges in the respective data signals.

23. The system of claim 18, further comprising receivers, provided on the second side of the isolation barrier between the isolators and respective channel sinks, to generate data signals in response to signals received from the isolators.

24. The system of claim 18, further comprising:
a plurality of arbiters, provided on the second side of the isolation barrier, each receiving a data signal from a respective isolator, and
a refresh signal decoder to generate state data from refresh signals received from the $N+2^{nd}$ isolator, having outputs coupled to each arbiter for state data of the arbiter's respective isolator.

25. The system of claim 24, wherein the arbiters output data representing the input state data after predetermined time(s) of inactivity on the data signal received from the respective isolator.

* * * * *